United States Patent [19]

Sekiguchi

[11] 3,953,747
[45] Apr. 27, 1976

[54] AC WAVE SWITCHING CIRCUIT USING AT LEAST ONE SWITCHING TRANSISTOR
[75] Inventor: Kouichi Sekiguchi, Asaka, Japan
[73] Assignee: Iwasaki Tsushinki Kabushiki Kaisha, Japan
[22] Filed: Feb. 6, 1974
[21] Appl. No.: 439,984

[30] Foreign Application Priority Data
Feb. 10, 1973 Japan............................. 48-16118
July 18, 1973 Japan............................. 48-80315

[52] U.S. Cl............................... 307/253; 307/254; 307/314
[51] Int. Cl.²........................................ H03K 17/00
[58] Field of Search.......... 307/253, 254, 255, 314, 307/210, 202; 328/91; 331/149

[56] References Cited
UNITED STATES PATENTS

| | | | |
|---|---|---|---|
| 2,956,182 | 10/1960 | Norman | 307/212 |
| 3,165,640 | 1/1965 | Fitzwater, Jr. | 328/91 |
| 3,188,496 | 6/1965 | Ballard | 307/202 |
| 3,289,040 | 11/1966 | Pfau et al. | 307/314 |
| 3,466,462 | 9/1969 | Houhsome | 307/314 |
| 3,505,540 | 4/1970 | Ferrari | 307/314 |
| 3,654,485 | 4/1972 | Lotz | 307/210 |

FOREIGN PATENTS OR APPLICATIONS
39,858   7/1967   Japan............................. 307/210

Primary Examiner—Stanley D. Miller, Jr.
Assistant Examiner—B. P. Davis
Attorney, Agent, or Firm—Robert E. Burns; Emmanuel J. Lobato; Bruce L. Adams

[57] ABSTRACT

An AC wave switching circuit in which the collector-emitter path of a switching transistor is inserted in series in the circuit loop of an AC signal to be switched. A control voltage source capable of flowing a DC current greater than a peak value of the AC signal current is connected across the base-emitter path of the switching transistor, so that the switching of the AC signal is performed by the voltage of the control voltage source without flowing any DC current in the collector-emitter path of the transistor. The collector-emitter path of another switching transistor may be connected in series or in parallel with the collector-emitter path of the first-mentioned switching transistor. At least one of a diode and a resistor may be included in the base-emitter path circuit of each switching transistor. The circuit loop may provide an output by transformer coupling or the capacitor coupling.

20 Claims, 9 Drawing Figures

AC WAVE SWITCHING CIRCUIT USING AT LEAST ONE SWITCHING TRANSISTOR

This invention relates to AC wave switching circuit for switching an AC signal such as a voice wave.

In a conventional AC wave switching circuit, the switching is achieved by the voltage control of a control power source connected across the base-emitter path of a transistor, which is inserted in series in the circuit loop of the AC signal to be switched. In this construction, however, it is necessary to control the control power source to flow a DC current in the collector-emitter path of the transistor by the DC power source. Therefore, in a case of applying such a switching circuit to control an LC resonance circuit, a choke-coil is necessary for providing a DC supply current to the transistor by the DC power source. This leads to defects such as bulkiness of the entire circuit construction and a lowering of the Q of the LC resonance circuit, so that a serious problem is caused in the practice of AC wave switching in the prior art.

An object of this invention is to eliminate the above mentioned defects of the conventional arts and to provide an AC wave switching circuit capable of reliably switching an AC wave by a simple circuit construction without flowing a DC current across the collector-emitter path of a switching transistor.

In accordance with the principle of this invention, a control voltage source capable of flowing a DC current greater than a peak value of an AC current in the circuit loop of an AC signal to switched is connected across the base-emitter path of a switching transistor, whose collector-emitter path is inserted in series in the circuit loop of an AC signal. The switching of the AC signal is performed by the voltage control of the control voltage source.

The principle, construction and operations of this invention will be readily understood from the following detailed description taken in conjunction with the accompanying drawings, in which.

Figure 1:
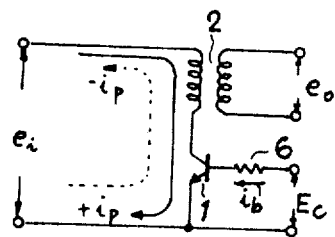
FIG. 1 is a circuit diagram illustrating an example of this invention.

With reference to FIG. 1, an example of this invention comprises a transformer 2 having a primary winding and a secondary winding, and a transistor 1 whose collector-emitter path is connected in series to the primary winding of the transistor 2 to form a circuit loop of an input AC signal $e_i$. A control voltage source $E_c$ is connected across the base-emitter path of the transistor 1 through a resistor 6.

Figure 2:
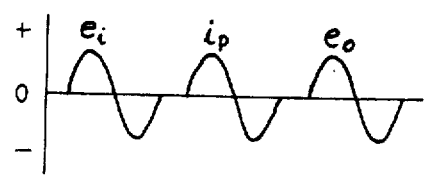
FIG. 2 is a wave form diagram explanatory of the operations of the example shown in FIG. 1.

FIG. 2 illustrates waveforms showing the relationship among the AC input signal $e_i$, an AC signal current $i_p$ flowing through the primary winding of the transformer 2 and the emitter-collector path of the transistor 1, and the output signal $e_o$ developed; in response to the input signals $e_i$ when the base current $i_b$ of the transistor 1 is sufficiently large. In the arrangement of FIG. 1, if the base current $i_b$ is established at a value greater than the peak value of the AC signal current $i_p$ by controlling the control voltage source $E_c$, the AC signal current $i_p$ fows in positive and negative directions in proportion to the AC input signal $e_i$ as shown in FIG. 2, so that the output signal $e_o$ is obtained without distortion.

The above operations will be further described in detail below.

In a case where the AC signal current $i_p$ flows in a direction $+i_p$ indicated by the solid line, the transistor 1 performs its normal operation as described above so that the relation where $i_p$ 32 $h_{fe}.i_b$ exists. In this case, the relation in that $i_b > i_p$ is provided and $h_{fe}$ has a value of several tens, so that the transistor 1 is turned-ON. Namely, the transistor 1 is switched to its ON-state.

In a case where the AC signal current $i_p$ flows in a direction $-i_p$ indicated by the broken line, the base current $i_b$ is shunted in proportion to an increase in the AC input signal by the diode characteristic provided at the base-collector junction of the transistor 1, whose base and collector correspond to an anode and a cathode, respectively. Further, an increase in the collector voltage in the negative direction results in making the base potential negative with respect to the emitter, which causes a decrease in the bias voltage of the base-emitter path of the transistor 1 and a decrease in the current flowing through the base-emitter path. As a result of this, the current flowing through the base-emitter path of the transistor 1 is decreased by a value corresponding to the amount of the base current $i_b$ shunted between the base and the collector of the transistor 1. However, an AC signal current $-i_p$ flows through the transistor 1. Namely, the transistor 1 is in its ON-state.

Further, in a case where the base current $i_b$ is zero, the transistor 1 is in its OFF state as known.

As described above, in the present invention, switching of the AC signal is achieved by controlling the base current of the transistor 1 inserted in series in the circuit loop of an AC signal circuit as shown in FIG. 1 in such a manner that the resistance of the collector-emitter path of the transistor 1 may satisfy such a condition as mentioned above.

Figure 3:
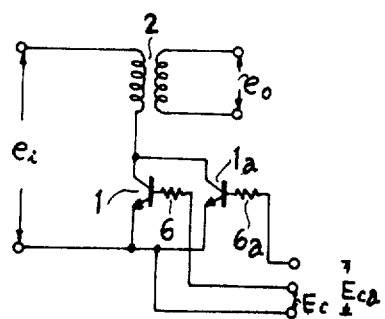
FIGS. 3, 4, 5, 6, 7, 8 and 9 are circuit diagrams each illustrating an example of this invention.
Figure 4:
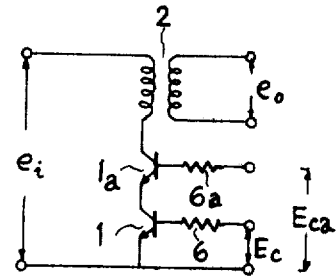

FIG. 3 illustrates another example of this invention which employs two switching transistors 1 and 1a connected in parallel with each other. FIG. 4 shows another example of this invention which similarly employs two transistors 1 and 1a connected in series to each other. In these FIGS. 3 and 4, reference numerals 6 and 6a denote resistors, and reference characters $E_c$ and $E_{ca}$ indicate control voltage sources. The number of employed transistors need not be limited specifically to two but may be more.

Figure 5:
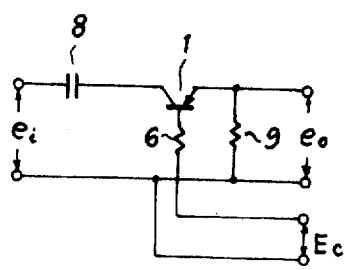

FIG. 5 illustrates still another example of this invention, in which a reference numeral 8 identifies a capacitor and 9 designates a resistor. The examples of FIGS. 1 to 4 employ transformer coupling, in which the switched output is obtained from the secondary winding of the transformer. However, the example of FIG. 5 employs capacitor coupling, in which the loop circuit of the AC signal includes the capacitor 8, the collector-emitter path of the transistor 1, and the resistor 9 while the switched output is obtained across the resistor 9.

Figure 6:
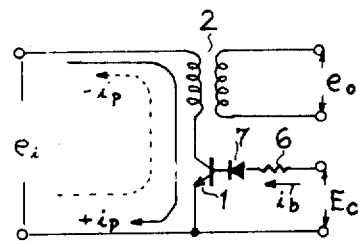

FIG. 6 illustrates another example of this invention, which is different from the example shown in FIG. 1 at a point in that a diode 7 is further inserted in series between the base of the transistor 1 and the control voltage source $E_c$. The diode 7 is provided to prevent, when the transistor 1 is in its OFF-state, the resistor 6 from providing an insertion shunt loss. If the transistor 1 is in its ON-state, since the resistance value of the collector-emitter path is small, the value of the resistor 6 is negligible in practice. However, if the transistor 1 is in its OFF-state, the resistance value of its collector-emitter path is large, so that the value of the resistor 6 is not negligible unless it is sufficiently large. This leads to deterioration of the OFF-characteristic of the switch. Namely, when the switch is in its OFF-state, the control voltage source $E_c$ is zero. That is, at the time of switching-OFF, the AC signal current $i_p$ based on the AC input signal $e_i$ can be cut-off by the characteristic of the transistor 1 but the AC signal current $-i_p$ flows through the resistor 6 due to the diode characteristic of the collector-emitter path of the transistor 1. Namely, the current $-i_p$ is not completely switch-off and may flow in the resistors 6. Then, the current $-i_p$ is prevented from flowing through the resistor 6 by inserting the diode 7 as shown in FIG. 6. Thus, the OFF-characteristic of the switch relating to the current $-i_p$ can be improved.

Figure 7:
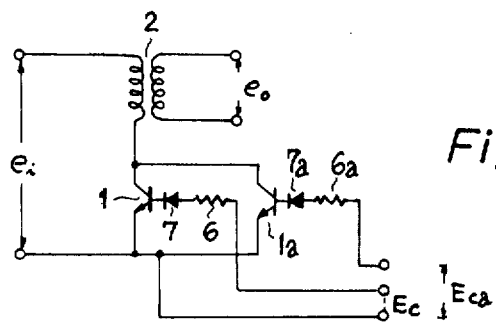
Figure 8:
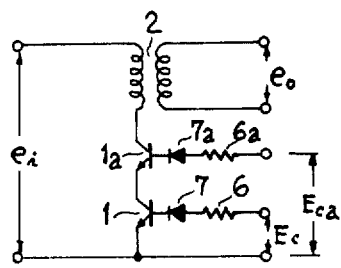

FIG. 7 illustrates another example of this invention which includes two parallel-connected switching transistors 1 and 1a in the similar construction as that shown in FIG. 6. FIG. 8 shows another example of this invention which similarly employs two transistors 1 and 1a connected in series to each other. In FIGS. 7 and 8, reference numerals 6 and 6a indicate resistors, and 7 and 7a designate diodes. Reference characteris $E_c$ and $E_{ca}$ identify control voltage sources. The number of employed transistors need not be limited specifically to two but may be more.

Figure 9:
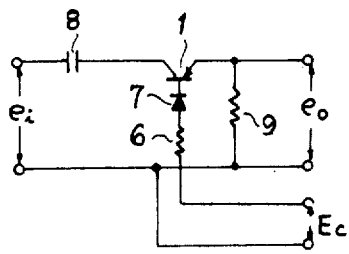

FIG. 9 illustrates still another example of this invention, in which a reference numeral 8 designates a capacitor and 9 represents a resistor. The examples of FIGS. 6 to 8 employs the transformer coupling as described with reference to FIGS. 1 to 4, while the example of FIG. 9 employs the capacitor coupling as described with reference to FIG. 5.

As has been described in detail above, this invention enables switching of an AC wave without impressing a DC bias across the emitter-collector path of the switching transistor. Consequently, the DC supply circuit can be eliminated and, in addition, especially in the case of applying the circuit of this invention to vary circuit constants of an LC resonance circuit or in the case of controlling a plurality of appropriate switching operations in parallel in an AC signal circuit, there are no possibilities of lowering the Q of the circuit and the performance of a filter, an oscillator or the like employing the resonance circuit as experienced in the prior art. Further, a series-connection of a resistor and a diode is connected to the base of the transistor, so that the characteristic at the time of switching off the transistor can be improved. The resistor of the diode may be removed.

Thus, this invention is very effective for reduction of the size and weight of devices and improvement of their performance.

What I claim is:

1. An AC wave switching circuit, comprising:
   a circuit loop for receiving an AC signal to be switched;
   a switching transistor having the collector-emitter path thereof inserted in series in said circuit loop; and
   control voltage source means for providing a DC current greater than a peak value of the AC signal current and connected across the base-emitter path of the switching transistor, so that the switching of the AC signal is performed by controlling the voltage of the control voltage source means without flowing any DC current in the collector-emitter path of the transistor.

2. An AC wave switching circuit according to claim 1, further including a second switching transistor having the collector-emitter path thereof connected in series to the collector-emitter path of the first-mentioned transistor, and second control voltage source means for providing a DC current greater than a peak value of the AC signal current and connected across the base-emitter path of the second switching transistor.

3. An AC wave switching circuit according to claim 1, further including a second switching transistor having the collector-emitter path thereof connected in series to the collector-emitter path of the first-mentioned transistor, and second control voltage source means for providing a DC current greater than a peak value of the AC signal current and connected across the base-emitter path of the second switching transistor.

4. An AC wave switching circuit according to claim 1, in which said circuit loop includes a transformer primary winding of a transformer having a secondary winding so that a switched output signal is obtained from the secondary winding of the transformer.

5. An AC wave switching circuit according to claim 1, in which said circuit loop includes a capacitor and a resistor so that a switched output signal is obtained across the resistor.

6. An AC wave switching circuit, comprising:
   a circuit loop for receiving an AC signal to be switched;
   a switching transistor having the collector-emitter path thereof inserted in series in said circuit loop;
   a resistor connected in series with the base-emitter path of the transistor; and
   control voltage source means for providing a DC current greater than a peak value of the AC signal current and connected across the base-emitter path of the switching transistor through said resistor, so that the switching of the AC signal is performed by controlling the voltage of the control voltage source means without flowing any DC current in the collector-emitter path of the transistor.

7. An AC wave switching circuit according to claim 6, further including a second switching transistor having the collector-emitter path thereof connected in parallel to the collector-emitter path of the first-mentioned transistor, a second resistor connected to the base of said second transistor, and second control voltage source means for providing a DC current greater than a peak value of the AC signal current and connected across the base-emitter path of the second switching transistor in series with the second resistor.

8. An AC wave switching circuit according to claim 6, further including a second switching transistor having the collector-emitter path thereof connected in series to the collector-emitter path of the first mentioned transistor, a second resistor connected to the base of said second transistor, and second control voltage source means for providing a DC current greater than a peak value of the AC signal current and connected across the base-emitter path of the second switching transistor in series with the second resistor.

9. An AC wave switching circuit according to claim 6, in which said circuit loop includes a transformer primary winding of a transformer having a secondary winding so that a switched output signal is obtained from the secondary winding of the transformer.

10. An AC wave switching circuit according to claim 6, in which said circuit loop includes a capacitor and a resistor so that a switched output signal is obtained across the resistor.

11. An AC wave switching circuit, comprising:
a circuit loop for receiving an AC signal to be switched;
a switching transistor having the collector-emitter path thereof inserted in series in said circuit loop;
a diode connected in series with the base-emitter path of the transistor; and
control voltage source means for providing a DC current greater than a peak value of the AC signal and connected across the base-emitter path of the switching transistor through said diode, the diode being arranged in the forward direction of the control current of the control voltage source means to provide a conductive path for the control current, so that the switching of the AC signal current is performed by controlling the voltage of the control voltage source means without flowing any DC current in the collector-emitter path of the transistor.

12. An AC wave switching circuit according to claim 11, further including a second switching transistor having the collector-emitter path thereof connected in parallel to the collector-emitter path of the first-mentioned transistor, a second diode connected to the base of said second transistor, and second control voltage source means for providing a DC current greater than a peak value of the AC signal current and connected across the base-emitter path of the second switching transistor in series with the second diode directed in the forward direction of the control current of the second control voltage source means.

13. An AC wave switching circuit according to claim 11, further including a second switching transistor having the collector-emitter path thereof connected in series to the collector-emitter path of the first mentioned transistor, a diode connected to the base of said second transistor and second control voltage source means for providing a DC current greater than a peak value of the AC signal, current and connected across the base-emitter path of the second switching transistor in series with the second diode directed in the forward direction of the control current of the second control voltage source means.

14. An AC wave switching circuit according to claim 11, in which said circuit loop includes a transformer primary winding of a transformer having a secondary winding so that a switched output signal is obtained from the secondary winding of the transformer.

15. An AC wave switching circuit according to claim 11, in which said circuit loop includes a capacitor and a resistor so that a switched output signal is obtained across the resistor.

16. An AC wave switching circuit, comprising:
a circuit loop for receiving an AC signal to be switched; a switching transistor having the collector-emitter path thereof inserted in series in said circuit loop;
a resistor and a diode connected in series with the base-emitter path of the transistor; and
control voltage source means for providing a DC current greater than a peak value of the AC signal current and connected across the base-emitter path of the switching transistor through said series-connected resistor and diode, the diode being arranged in the forward direction of the control current of the control voltage source means, so that the switching of the AC signal is performed by controlling the voltage of the control voltage source means without flowing any DC current in the collector-emitter path of the transistor.

17. An AC wave switching circuit according to claim 16, further including a second switching transistor having the collector-emitter path thereof connected in parallel to the collector-emitter path of the first-mentioned transistor, a second resistor and a second diode connected in series to the base of the second transistor, and second control voltage source means for providing a DC current greater than a peak value of the AC signal current and connected across the base-emitter path of the second switching transistor in series with the second resistor and with the second diode directed in the forward direction of the control current of the second control voltage source means.

18. An AC wave switching circuit according to claim 16, further including a second switching transistor having the collector-emitter path thereof connected in series to the collector-emitter path of the first-mentioned transistor, a second diode connected to the base of the second transistor, and second control voltage source means for providing a DC current greater than a peak value of the AC signal current and connected across the base-emitter path of the second switching transistor in series with a second transistor and the second diode directed in the forward direction of the control current of the second control voltage source means.

19. An AC wave switching circuit according to claim 16, in which said circuit loop includes a transformer primary winding of a transformer having a secondary winding so that a switched output signal is obtained from the secondary winding of the transformer.

20. An AC wave switching circuit according to claim 16, in which said circuit loop includes a capacitor and a resistor so that a switched output signal is obtained across the resistor.

* * * * *